(12) United States Patent
Kawaguchi et al.

(10) Patent No.: US 10,734,869 B2
(45) Date of Patent: Aug. 4, 2020

(54) CONTROL DEVICE WITH SEMICONDUCTOR MODULE HAVING BENT LATCH, CONTROL, POWER SUPPLY AND MOTOR CONTROL TERMINALS

(71) Applicant: Mitsubishi Electric Corporation, Tokyo (JP)

(72) Inventors: Takahisa Kawaguchi, Tokyo (JP); Kazuhisa Takashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 15/569,115

(22) PCT Filed: Apr. 27, 2015

(86) PCT No.: PCT/JP2015/062649
§ 371 (c)(1),
(2) Date: Oct. 25, 2017

(87) PCT Pub. No.: WO2016/174704
PCT Pub. Date: Nov. 3, 2016

(65) Prior Publication Data
US 2018/0123431 A1    May 3, 2018

(51) Int. Cl.
*H02K 11/33*        (2016.01)
*H02K 29/00*        (2006.01)
(Continued)

(52) U.S. Cl.
CPC ........... *H02K 11/33* (2016.01); *B62D 5/0406* (2013.01); *H01L 25/065* (2013.01); *H01L 25/07* (2013.01);
(Continued)

(58) Field of Classification Search
CPC ........ H02K 11/33; H02K 11/00; H02K 5/225; H02K 29/00; B62D 5/0406; H01L 25/065;
(Continued)

(56) References Cited

U.S. PATENT DOCUMENTS 7,183,681 B2 * 2/2007 Segawa ................. B62D 5/0403
310/68 B
9,899,891 B2 * 2/2018 Sawada .................. H02K 3/522
(Continued)

FOREIGN PATENT DOCUMENTS

JP    2011-010410 A    1/2011
JP    2013-110782 A    6/2013
(Continued)

OTHER PUBLICATIONS

Extended European Search Report dated Oct. 25, 2018, issued by the European Patent Office in counterpart application No. 15890688.3.
(Continued)

*Primary Examiner* — Maged M Almawri
(74) *Attorney, Agent, or Firm* — Sughrue Mion, PLLC; Richard C. Turner

(57) ABSTRACT

The present invention is concerning the control device equipped with a motor 2 and a control unit 1 which is coaxial to the motor 2. An upper frame 40 is arranged at a boundary between the motor 2 and the control unit 1. A semiconductor module 35, an intermediate member 50, and a control board 3 are provided in the control unit 1. For assembly of the semiconductor module 35 and the intermediate member 50, a latch portion 35*f* is provided on one of the semiconductor module 35 and the intermediate member 50, and an engaged portion into which the latch portion 35*f* locks is provided on the other of the semiconductor module 35 and the interme- (Continued)

diate member 50, whereby positioning of the semiconductor module 35 and the intermediate member 50 is achieved.

14 Claims, 5 Drawing Sheets

(51) Int. Cl.
| | | |
|---|---|---|
| *H01L 25/18* | (2006.01) | |
| *H02K 11/00* | (2016.01) | |
| *H02M 7/48* | (2007.01) | |
| *H01L 25/07* | (2006.01) | |
| *B62D 5/04* | (2006.01) | |
| *H01L 25/065* | (2006.01) | |
| *H02K 5/22* | (2006.01) | |
| *H02M 7/537* | (2006.01) | |
| *H02P 27/06* | (2006.01) | |

(52) U.S. Cl.
CPC ............ *H01L 25/18* (2013.01); *H02K 5/225* (2013.01); *H02K 11/00* (2013.01); *H02K 29/00* (2013.01); *H02M 7/48* (2013.01); *H01L 2224/0603* (2013.01); *H01L 2224/40* (2013.01); *H01L 2224/40245* (2013.01); *H01L 2224/48247* (2013.01); *H01L 2224/73221* (2013.01); *H01L 2924/00014* (2013.01); *H02M 7/537* (2013.01); *H02P 27/06* (2013.01)

(58) Field of Classification Search
CPC . H01L 25/07; H01L 25/18; H01L 2224/0603; H01L 2224/40; H01L 2224/40245; H01L 2224/48247; H01L 2224/73221; H01L 2924/00014; H02M 7/48; H02M 7/537; H02P 27/06

USPC .......................................................... 310/71
See application file for complete search history.

(56) References Cited

U.S. PATENT DOCUMENTS

| | | | | |
|---|---|---|---|---|
| 10,122,248 | B2* | 11/2018 | Acinas Lope | ....... B62D 5/0406 |
| 10,167,012 | B2* | 1/2019 | Asao | ...................... B62D 5/046 |
| 10,236,750 | B2* | 3/2019 | Hirotani | ............... H02K 11/024 |
| 2010/0327677 | A1* | 12/2010 | Iwai | .................... H01L 23/3107 |
| | | | | 310/64 |
| 2011/0278995 | A1* | 11/2011 | Akutsu | ................ B62D 5/0403 |
| | | | | 310/68 D |
| 2013/0062745 | A1* | 3/2013 | Kimura | .............. H01L 23/4334 |
| | | | | 257/675 |
| 2014/0091683 | A1* | 4/2014 | Ito | ........................ B62D 5/0406 |
| | | | | 310/68 R |
| 2014/0326530 | A1* | 11/2014 | Asao | .................... B62D 5/0406 |
| | | | | 180/443 |
| 2016/0079825 | A1* | 3/2016 | Sawada | ................. H02K 3/522 |
| | | | | 310/43 |

FOREIGN PATENT DOCUMENTS

| | | |
|---|---|---|
| JP | 5317846 B2 | 10/2013 |
| JP | 2014-075866 A | 4/2014 |
| JP | 2014-212666 A | 11/2014 |

OTHER PUBLICATIONS

International Search Report for PCT/JP2015/062649, dated Aug. 4, 2015.

\* cited by examiner

CONTROL DEVICE WITH SEMICONDUCTOR MODULE HAVING BENT LATCH, CONTROL, POWER SUPPLY AND MOTOR CONTROL TERMINALS

CROSS REFERENCE TO RELATED APPLICATIONS

This application is a National Stage of International Application No. PCT/JP2015/062649 filed Apr. 27, 2015, the contents of all of which are incorporated herein by reference in their entirety.

TECHNICAL FIELD

The present invention relates to a control device, and more specifically to a control device including semiconductor modules which constitute an inverter circuit for driving, for example, an electric motor.

BACKGROUND ART

In conventional control devices to be used in vehicles, integration in which a control unit is unified with a motor has been proposed in order to reduce the size of, for example, an electric power steering device. In order to reduce the size of the entire device, it is also necessary to reduce the size of components to be used. For this reason, semiconductor modules have been used as an inverter for supplying and cutting off current to a motor. A plurality of switching elements are incorporated in each of the semiconductor modules. Mountability of the semiconductor modules is an important prerequisite to reduction of size and assemblability. Accordingly, a variety of aspects, such as heat dissipation, control amount output circuitry, and connectivity with motor windings, etc. must be taken into consideration in the semiconductor modules.

In a conventional electric power steering device, a motor case which houses a motor constituted by a rotor and a stator is used, and semiconductor modules are mounted thereon in a manner so as not to deviate in position. For this purpose, a special terminal extends from each semiconductor module. Further, a hole or groove for the special terminal to engage with is provided in the motor case, whereby the semiconductor module and the motor case are engaged with each other (see PTL 1, for example).

CITATION LIST

Patent Literature

[PTL 1] Japanese Patent No. 5317846

SUMMARY OF INVENTION

Technical Problem

In the configuration of the conventional device described in the abovementioned PTL 1, an engagement portion is provided in a metal member, namely the motor case so as to improve positional accuracy of the semiconductor module. In many cases, machine processing is required when providing an engagement portion in a metal member. For this reason, providing an engagement portion resulted in escalated cost and an increase in the number of managed processes.

The present invention has been made to solve the problems described above, and an object thereof is to provide a control device in which, by simplifying the attachment process of the semiconductor module without affecting a motor side configuration, a semiconductor module can be positioned appropriately while suppressing an escalation in cost.

Solution to Problem

The present invention is a control device provided with a housing, a motor provided in the housing, a control unit provided in the housing and used for controlling the motor, and a frame arranged in the housing and constituting a boundary plate between the motor and the control unit, wherein a semiconductor module, an intermediate member, and a control board are stacked sequentially in the control unit, the semiconductor module is interposed between the frame and the intermediate member so as to be in contact with the frame and the intermediate member, a latch portion is provided on one of the semiconductor module and the intermediate member, an engaged portion is provided on the other of the semiconductor module and the intermediate member, and at least one of the latch portion and the engaged portion is formed from an insulator, and the semiconductor module and the intermediate member are engaged with each other by engaging the latch portion with the engaged portion.

Advantageous Effects of Invention

With the control device according to the present invention, a latch portion is provided on one of the semiconductor module and the intermediate member, an engaged portion is provided on the other of the semiconductor module and the intermediate member, and at least one of the latch portion and the engaged portion is formed from an insulator and, as the semiconductor module and the intermediate member are engaged with each other by engaging the latch portion with the engaged portion, the semiconductor module can be positioned appropriately while suppressing an escalation in cost by simplifying the attachment process of the semiconductor module without affecting a motor side configuration.

DESCRIPTION OF EMBODIMENTS

First Embodiment

Figure 1:
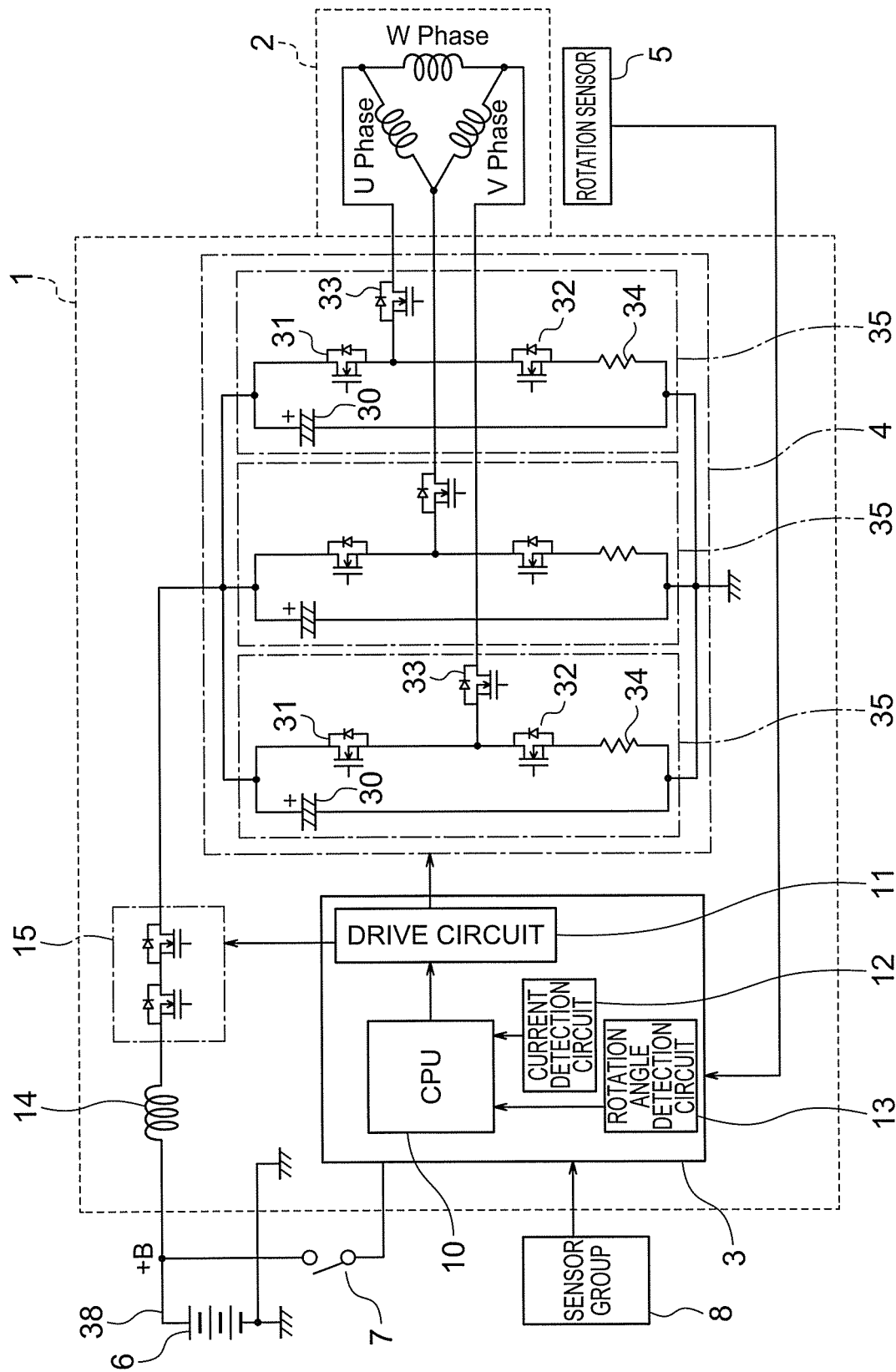
FIG. 1 is a circuit diagram showing a circuit configuration of a control device according to a first embodiment of the present invention.
Figure 2:
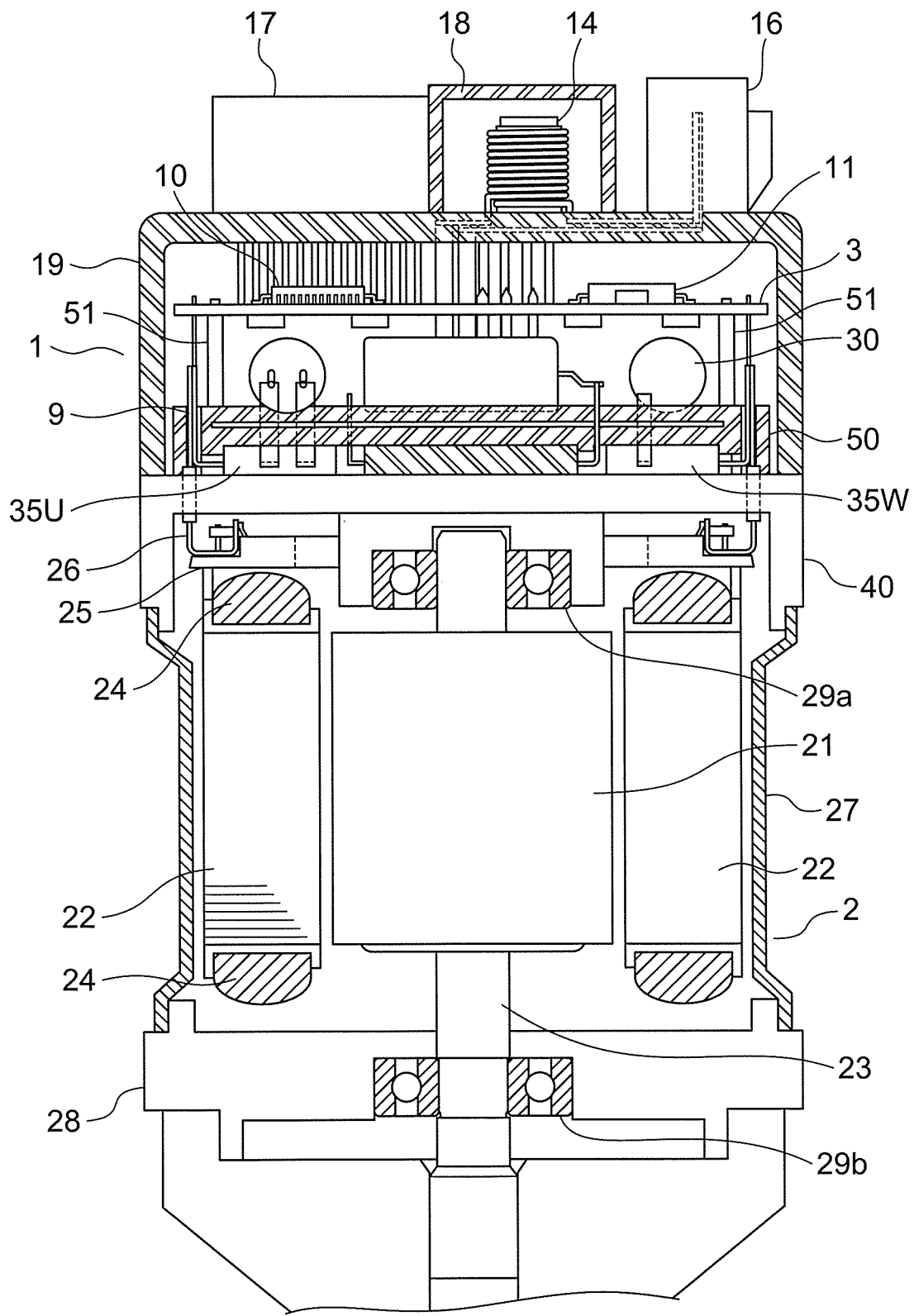
FIG. 2 is a partial cross-sectional view showing a configuration of the control device according to the first embodiment of the present invention.

A control device according to a first embodiment of the present invention will be described hereinafter with reference to the drawings. FIG. 1 is a circuit configuration diagram of the entire control device according to the present embodiment. As shown in FIG. 1, the control device is provided with a control unit 1 and a motor 2. The control unit 1 and the motor 2 are, as shown in FIG. 2 described hereinafter, integrated with each other. The motor 2 is a motor for assisting a steering force of a steering wheel (not shown) to be provided in a vehicle (not shown) for example. A rotation sensor 5 and a sensor group 8 are connected to the control unit 1. The rotation sensor 5 detects a rotation angle of the motor 2. The sensor group 8 includes a plurality of sensors such as a torque sensor for detecting the steering force of the steering wheel and a vehicle speed sensor for detecting a speed of the vehicle. These sensors included in the sensor group 8 are respectively installed in locations throughout the vehicle.

The motor 2 is constituted by a brushless motor. In the example shown in FIG. 1, the motor 2 is constituted by three phase windings. The phases of the motor 2 will hereinafter be referred to as the U phase, the V phase, and the W phase respectively. The motor 2 will hereinafter be described as a three-phase brushless motor. However, the motor 2 is not limited to a three-phase brushless type motor, and may also be a brushed motor or a multi-phase winding motor having three or more phases.

As shown in FIG. 1, a control board 3, an inverter circuit 4, a noise suppressing coil 14, and a relay element 15 are provided in the control unit 1.

The inverter circuit 4 supplies current to each of the motor windings of the motor 2, which correspond respectively to the U phase, the V phase, and the W phase. The inverter circuit 4 is constituted by three semiconductor modules 35. The semiconductor modules 35 are connected respectively to the U phase, the V phase and the W phase of the motor 2. Each of the semiconductor modules 35 has the same circuit configuration. In other words, each of the semiconductor modules 35 is mainly constituted by switching elements 31, 32, and 33, a capacitor 30, and a shunt resistor 34. The switching elements 31 and 32 and the shunt resistor 34 are connected in series. The shunt resistor 34 is constituted by a resistor capable of current detection. The capacitor 30 is connected in parallel to the series of switching elements 31 and 32. The capacitor 30 is provided in order to suppress noise such as pulsation. The switching element 33 is connected between the motor 2 and a connection point between the switching element 31 and the switching element 32. The switching element 33 is constituted by a switching element which has a relay function capable of cutting off current supply. The semiconductor modules 35 are configured as semiconductor modules by combining these components (30 to 34) into one. Note that, in the example shown in FIG. 1, each of the semiconductor modules 35 incorporates a circuit configuration for only one phase, however, the present invention is not limited to such a configuration, and a single semiconductor module may also incorporate a circuit configuration for two or three phases.

A CPU (microcomputer) 10, an interface drive circuit 11, a current detection circuit 12, and a rotation angle detection circuit 13 are mounted on the control board 3. The CPU 10 calculates and outputs a current value for driving the motor 2 on the basis of information from the sensor group 8. The interface drive circuit 11 performs transmission and reception of data between the semiconductor modules 35 and the CPU 10. The current detection circuit 12 amplifies current detected by the shunt resistors 34 and converts the current so as to enable input thereof to the CPU 10. The rotation angle detection circuit 13 inputs information from the rotation sensor 5, which detects the rotation angle of the motor 2, to the CPU 10.

Further, a power supply system line 38, to which power is directly input from a battery 6, is connected to the control unit 1. The power supply system line 38 is connected to a power supply terminal (+B) and ground. Note that, in this specification, a power supply line connected to the power supply terminal (+B) and a ground line connected to ground are collectively referred to as "the power supply system line". The noise suppressing coil 14 in the control unit 1 is connected in series to the power supply terminal (+B) of the power supply system line 38. An ignition switch 7 is also connected to the power supply terminal (+B). One end of the ignition switch 7 is connected to the power supply terminal (+B) and the other end of the ignition switch 7 is connected to the control board 3. A relay element 15 is connected in series to the noise suppressing coil 14. The relay element 15 has a power supply relay function which is capable of cutting off the power supply system line 38. One end of each of the semiconductor modules 35 of the inverter circuit 4 is connected to the relay element 15 and the other end of each of the semiconductor modules 35 is grounded. In this way, a large current is supplied from the battery 6 to the motor windings of the motor 2 via the noise suppressing coil 14, the relay element 15, and the inverter circuit 4. Note that it is also possible to incorporate the relay element 15 into the semiconductor modules 35. Further, it is also possible to form the relay element 15 as one semiconductor module.

The configuration in which the control unit 1 and the motor 2 are integrated with each other will be described hereinafter with reference to FIG. 2. Note that the lower side of the page on which FIG. 2 is shown depicts an output shaft 23 side of the motor 2, and the upper side of the page on which FIG. 2 is shown depicts a side opposite to the output side. In FIG. 2, structures which are the same as those shown as in FIG. 1 are denoted by the same reference numerals, and description thereof here will be omitted. In FIG. 2, however, the semiconductor modules 35 are distinguished by phase and are thus denoted as semiconductor modules 35U and 35W. The semiconductor module 35V is not shown in FIG. 2. The control unit 1 is coaxial to the output shaft 23 of the motor 2 and is mounted on the side opposite to the output side of the motor 2. Note that the present invention is not limited to such a configuration, and that the control unit 1 may also be mounted on the output side of the motor 2 or on a side surface of the motor 2.

The motor 2 includes an output shaft 23 at a center thereof. The output shaft 23 is provided with a rotor 21. A plurality of permanent magnets (not shown) are mounted on the rotor 21. A stator 22 is disposed around the rotor 21. Three-phase motor windings 24 are wound around the stator 22. The output shaft 23, the rotor 21, and the stator 22 are enclosed by a yoke 27, a lower frame 28, and an upper frame 40. In other words, the yoke 27 constitutes a side wall, the upper frame 40 constitutes an upper lid, and the lower frame 28 constitutes a bottom plate. Note that a lower side of the lower frame 28 is connected to a speed reducer (not shown) to which the rotation of the output shaft 23 is transmitted.

Motor winding ends are arranged at the top of the motor windings 24. A connection ring 25 for delta (Δ) connecting the three motor windings 24 as shown, for example, in FIG. 1, is arranged with respect to the motor winding ends. The last parts of the three motor winding ends extend upward as a total of three winding terminals 26 (only two of the phases, the U phase and the W phase, are shown in FIG. 2). A magnetic field is generated by supplying a current to the winding terminals 26. The magnetic field repels or attracts the magnets (not shown) mounted on the outer periphery of the rotor 21, whereby the rotor 21 rotates.

A bearing 29a is incorporated in a center portion of the upper frame 40. In the same way, a bearing 29b is incorporated in a center portion of the lower frame 28. The portion on the lower side of the upper frame 40 is the motor portion, and the portion on the upper side of the upper frame 40 is the control unit 1. Hence, the upper frame 40 is a boundary plate that forms a boundary between the motor 2 and the control unit 1. The main electronic components constituting the control unit 1 are housed in a housing 19. Connectors are arranged on an upper surface of the housing 19. The connectors include a power supply connector 16 and a sensor connector 17. A cover 18 which houses the noise suppressing coil 14 is also mounted on the upper surface of the housing 19. The power supply system line (+B and ground) and sensor lines, which extend from pins of the connectors 16 and 17, extend towards the inside of the control unit 1. The semiconductor modules 35U, 35V, and 35W, the intermediate member 50, and the control board 3 are stacked sequentially from the bottom in the space inside the control unit 1. The CPU 10 and the drive circuit 11 are mounted on the control board 3. There is a space between the intermediate member 50 and the control board 3. In this space, one of the capacitors 30 is arranged for each of the phases, i.e. the U phase, the V phase, and the W phase. The semiconductor modules 35 are respectively disposed right under the capacitors 30 with the intermediate member 15 interposed therebetween. The semiconductor modules 35 are interposed between the upper frame 40 and the intermediate member 50 and are arranged so as to be in contact with the upper frame 40 and the intermediate member 50.

The intermediate member 50 is made from an insulating resin. A large number of holes are provided in the intermediate member 50. Terminals of the semiconductor modules 35U, 35V, and 35W pass through the holes in the intermediate member 50. In addition, a plurality of pillars 51 stand upon an upper surface of the intermediate member 50. The control board 3 is supported by the pillars 51. Further, in order to enable positioning of the capacitors 30, recessed portions are provided in the upper surface of the intermediate member 50 so as to hug the outer shape of the capacitors 30. The winding terminals 26 of the motor 2 pass through holes provided in the upper frame 40 and the holes provided in the intermediate member 50 and extend in an upward direction. Terminals 9 of the winding terminals 26 are connected to terminals of the semiconductor modules 35U, 35V, and 35W by welding, for example. Other terminals extending from the semiconductor modules 35U, 35V, and 35W pass through the holes in the intermediate member 50 and extend in an upward direction. These terminals further pass through the control board 3 and are connected to the control board 3 by soldering, for example.

Figure 3:
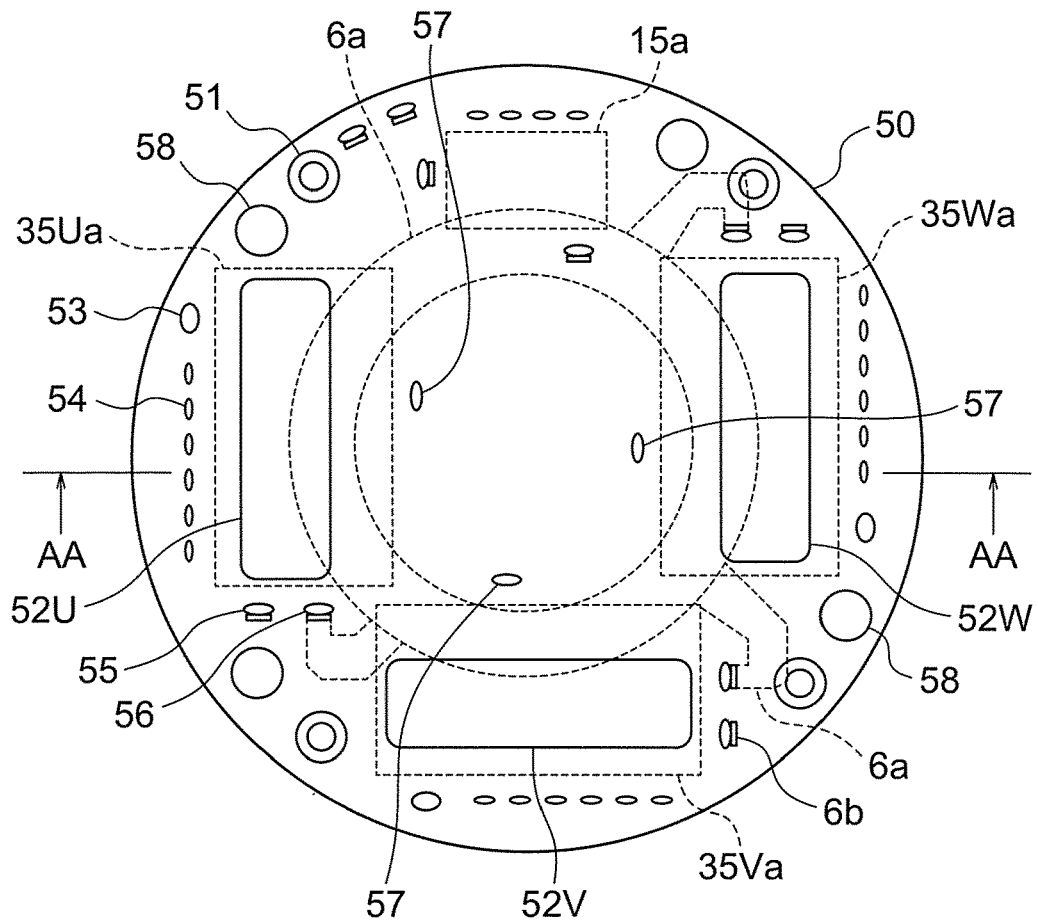
FIG. 3 is a plan view showing a configuration of an intermediate member provided in the control device according to the first embodiment of the present invention.
Figure 4:
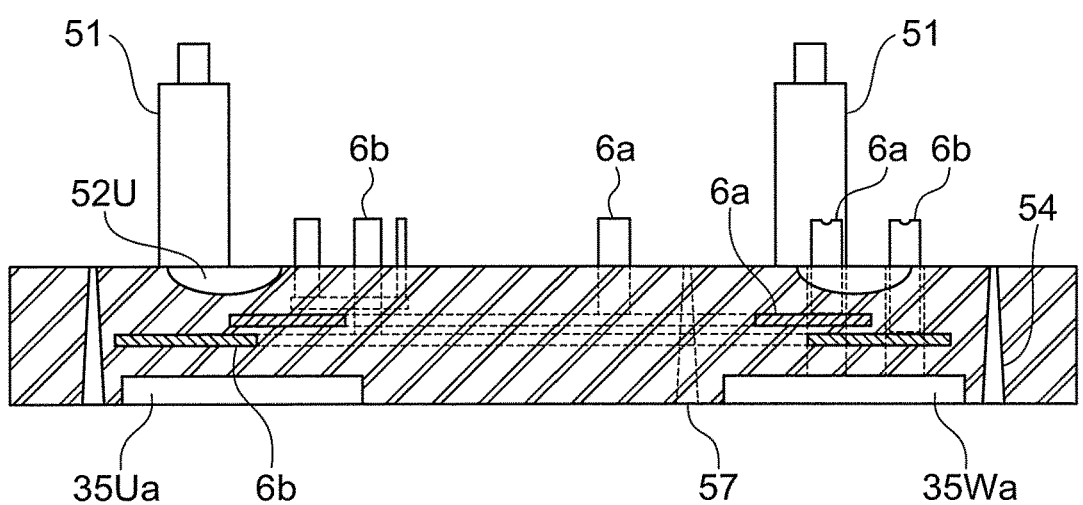
FIG. 4 is a cross-sectional view taken along the AA-AA line shown in FIG. 3 and showing a configuration of the intermediate member provided in the control device according to the first embodiment of the present invention.

The configuration of the intermediate member 50 is shown in FIG. 3 and FIG. 4. FIG. 3 is a plan view of the intermediate member 50, and FIG. 4 is a cross-sectional view taken along the AA-AA line shown in FIG. 3. In FIG. 3 and FIG. 4, structures which are the same as those in FIG. 1 and FIG. 2 are denoted by the same reference numerals, and description thereof here will be omitted. As shown in FIG. 2, the intermediate member 50 is arranged coaxially to the yoke 27 of the motor 2 and the upper frame 40, hence the intermediate member 50 has a circular shape. Recessed portions 35Ua, 35Va, and 35Wa for positioning the semiconductor modules 35U, 35V, and 35W are provided in a lower surface of the intermediate member 50. The recessed portions 35Ua, 35Va, and 35Wa are arranged sequentially counter clockwise around the shaft at positions rotated by 90° relative to the preceding recessed portion. In other words, the recessed portion 35Ua is arranged on the left side of the page on which FIG. 3 is shown, the recessed portion 35Wa is arranged on the right side of the page on which FIG. 3 is shown, and the recessed portion 35Va is arranged on the lower side of the page on which FIG. 3 is shown. As shown in FIG. 2, the semiconductor modules 35U, 35V, and 35W are mounted in the recessed portions 35Ua, 35Va, and 35Wa. In addition, terminal holes 53, 54, 55, and 56 are formed around the recessed portions 35Ua, 35Va, and 35Wa. The holes 53, 54, 55, and 56 are through holes which pass through the intermediate member 50. Further, a recessed portion 15a for arranging the relay element 15 is provided in the lower surface of the intermediate member 50. The recessed portion 15a is arranged on the upper side of the page on which FIG. 3 is shown. Terminal holes are formed around the recessed portion 15a. Further, recessed portions 52U, 52V, and 52W for positioning the capacitors 30 are provided in the upper surface of the intermediate member 50. The arrangement positions of the recessed portions 52U, 52V, and 52W are right above the arrangement positions of the semiconductor modules 35U, 35V, and 35W respectively, and the intermediate member 50 is interposed therebetween.

The intermediate member 50 is, as described above, formed from an insulating resin. At least two bus bars of a +B line 6a and a ground line 6b of the power supply system line 38 of the battery 6 are arranged inside the intermediate member 50. Although only the bus bar of the +B line 6a is shown by the broken line in FIG. 3, the bus bar of the ground line 6b also has the same shape. The +B line 6a is donut-shaped. The bus bar extends from the donut-shaped +B line 6a to the +B terminal of each of the semiconductor modules 35. Each tip of the bus bar is a terminal electrically connected to a terminal of one of the semiconductor modules 35. These terminals extend toward an upper side and protrude further upward than the main body of the intermediate member 50. The ground line 6b has the same configuration, and terminals of the ground line 6b are also connected to the semiconductor modules 35. Four holes 58 for fixing the intermediate member 50 to the upper frame 40 are provided on the outer edge of the intermediate member 50. The intermediate member 50 is coupled to the upper frame 40 using the holes 58 by screws, for example. Further, holes 57 are formed in three places on an inner side of the donut-shaped +B line 6a. These holes 57 are provided for the semiconductor modules 35 and the intermediate member 50 to engage with each other. The semiconductor modules 35 are each provided with a latch portion 35f (see FIG. 5) described hereinafter, and the latch portions 35f are fitted into the holes 57 such that the semiconductor modules 35 and the intermediate member 50 are engaged with each other. Accordingly, the holes 57 constitute engaged portions.

As shown in FIG. 2 and FIG. 4, columns 51 for supporting the control board 3 extend in an upward direction from the upper surface of the intermediate member 50. Further, in order to connect to the terminals of the semiconductor modules 35, the bus bars and terminals of the +B line 6a and the ground line 6b also extend in an upward direction from the upper surface of the intermediate member 50. The large number of holes 53 to 57 pass through the intermediate member 50 and are formed by molding. Note that, on taking into consideration terminal insertability, it is preferable that the holes 53 to 57 are, as shown in FIG. 4, conical holes which have a wide lower portion and a narrow upper portion. In particular, the holes 57 which constitute the engaged portions are preferably conical. The reason for this is that the holes 57, that is, the engaged portions, are provided for the semiconductor modules 35 and the intermediate member 50 to engage with each other. Meanwhile, the other holes 53 to 56 are provided to allow terminals to pass through. In this way, the holes 57 which constitute the engaged portions differ from the other holes 53 to 56 in terms of use. For this reason, the upper portions of the holes 57 in particular have a small hole diameter which is slightly larger than the outer diameter of the latch portion 35f provided on each of the semiconductor modules 35. The latch portion 35f, which extends from the semiconductor module 35, is fitted into this small hole diameter portion, whereby the latch portion 35f is locked into the hole 57.

Figure 5:
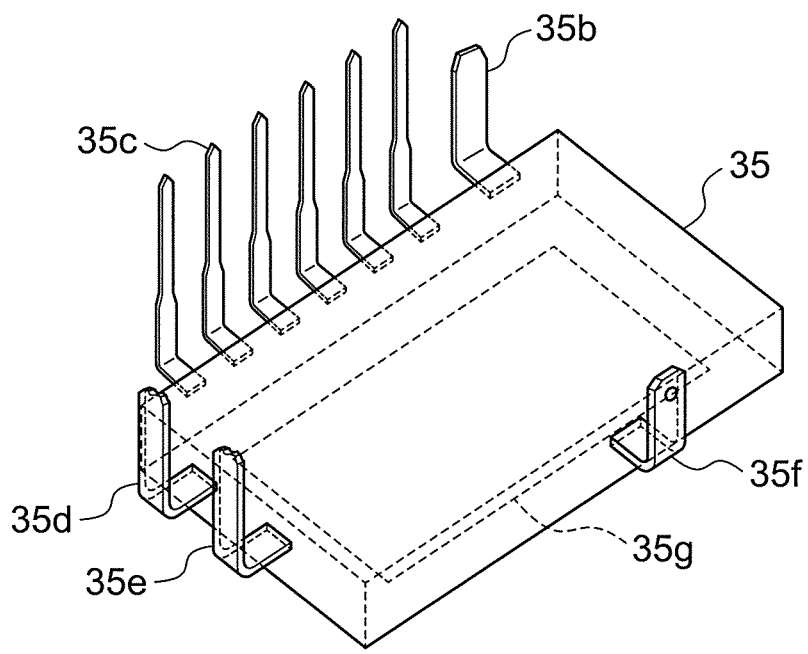
FIG. 5 is a perspective view showing a configuration of a semiconductor module provided in the control device according to the first embodiment of the present invention.
Figure 6:
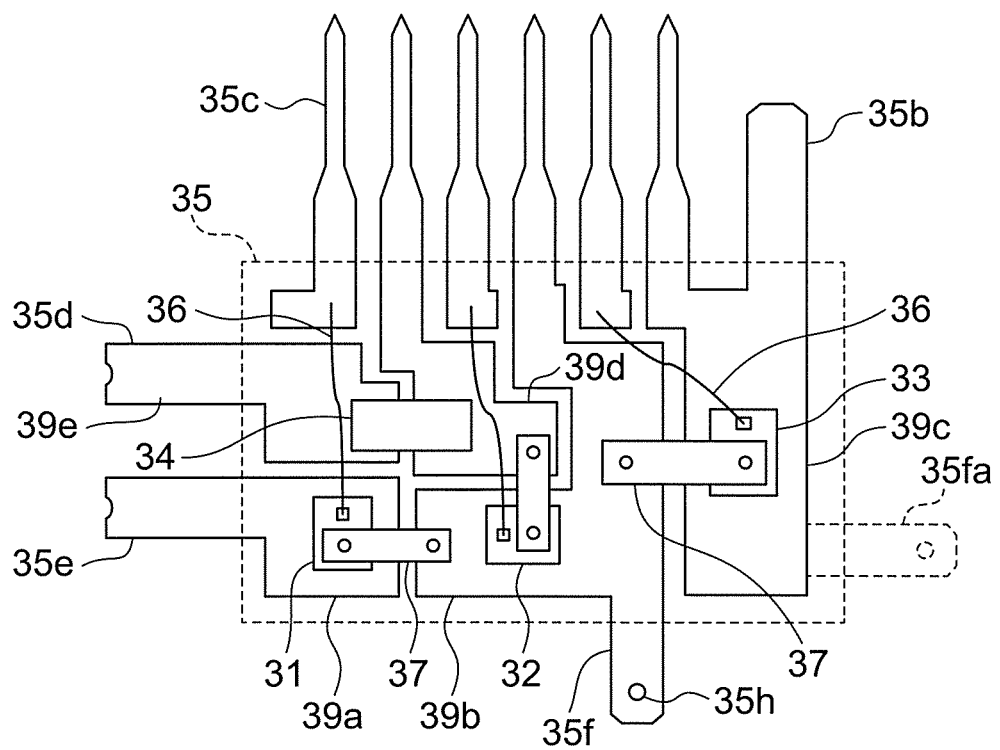
FIG. 6 is an internal perspective view showing the configuration of the semiconductor module provided in the control device according to the first embodiment of the present invention.

Next, the shape of the semiconductor modules 35 will be described with reference to FIG. 5 and FIG. 6. FIG. 5 is a perspective view, and FIG. 6 is an internal perspective view. Each semiconductor module 35 is constituted by a rectangular molded body 35a. In addition, the semiconductor module 35 is provided with a plurality of various terminals 35b to 35e. The plurality of switching elements 31 to 33 and the shunt resistor 34 shown in FIG. 1 are incorporated in the molded body 35a. A motor control terminal 35b and other control terminals 35c are provided on one side of the molded body 35a in the longitudinal direction. The motor control terminal 35b is formed to be comparatively wider than the other control terminals 35c so as to be easily connected to one of the coil winding terminals (26 in FIG. 2) of the motor 2. The control terminals 35c constitute control command signal lines and monitor lines from the control board 3. A power supply terminal 35d and a ground terminal 35e are provided on one side of the molded body 35a in the lateral direction. The power supply terminal 35d and the ground terminal 35e are also formed to be comparatively wider that the other control terminals 35c. Note that, in this specification, the power supply terminal and the ground terminal are collectively referred to as "the power supply system terminals".

The latch portion 35f is provided on the other side of the semiconductor module 35 in the longitudinal direction. Further, a window portion 35g for dissipating heat from the incorporated switching elements 31 to 33 is provided in the bottom of the molded body 35a. Lead frames provided inside the molded body 35a are exposed from the window portion 35g. The lead frames are not molded. The window portion 35g is in close contact with the upper surface of the upper frame 40 shown in FIG. 2 via an insulating member (not shown), whereby heat dissipation is improved. In other words, heat from the lead frames is transferred to the upper frame 40 via the window portion 35g and the insulating member (not shown), and is dissipated from the upper frame 40 to the outside.

FIG. 6 shows an internal perspective view of the semiconductor module 35. As shown in FIG. 6, a large number of lead frames 39 are incorporated in the molded body 35a. The switching elements 31 to 33 are mounted on upper surfaces of the lead frames 39. Each part will be described on the basis of the circuit diagram shown in FIG. 1. First, the switching element 31, which serves as an upper arm, is mounted on a lead frame 39a which extends from the power supply terminal (+B) 35e of the power supply system line 38. When the switching element 31 is constituted by a MOSFET, a lower surface of the switching element 31 is a drain, an upper surface thereof is a source, and a portion thereof connected to a wire bond 36 is a gate. One end of a wide beam 37 is connected to this source. The other end of the beam 37 is connected to another adjacent lead frame 39b. The lower arm switching element 32 is disposed on the lead frame 39b. The lead frame 39b is further connected to an adjacent lead frame 39c by another beam 37. The switching element 33 is arranged on the lead frame 39c. A drain of the switching element 33 is extended to form the motor control terminal 35b. A beam 37 connected to the source of the lower arm switching element 32 is connected to another lead frame 39d. One end of the shunt resistor 34 is connected to the lead frame 39d. The other end of the shunt resistor 34 is connected to another lead frame 39e. A tip of the lead frame 39e is elongated as the ground terminal 35d and protrudes to the outside from the molded body 35a. Note that, as shown in FIG. 6, recessed portions are formed at tips of the power supply terminal 35d and the ground terminal 35e. These recessed portions are grooves for connecting leg portions of the capacitors 30. By placing terminals of the capacitors 30 in these grooves, the capacitors 30 can be electrically connected to respective parts of the semiconductor modules.

Further, other terminals (not shown) are arranged on the semiconductor module 35 for monitoring the voltage of respective parts. In addition, the six control terminals 35c connected to the wire bonds 36 for the gates of the respective switching elements 31 to 33 are also provided. Each of the parts described above is covered by the molded body 35a to form the semiconductor module 35. The latch portion 35f is formed by elongating a portion of the lead frame 39b, that is, a connecting portion between the switching elements 32 and 33, into a terminal shape. Although there is no particular preference to arranging the latch portion 35f at a site that indicates an electrical position, the latch portion 35f is, as shown in FIG. 6, arranged on the opposite side to the motor control terminal 35b and the control terminals 35c. Further, the present invention is not limited to such a configuration, and the latch portion may also be arranged, for example, on the opposite side to the power supply terminal 35d and the ground terminal 35e, as with the latch portion 35fa indicated by the broken line in FIG. 6. It is preferable that the latch portion 35f is disposed in this way, i.e. on a side at which terminals of the semiconductor module 35 are not disposed. As the latch portion 35f or 35fa is irrelevant to electrical connection, in contrast to the other terminals, it is not at all necessary to connect the latch portion 35f or 35fa to the control board 3 and members other than the control board 3. For this reason, the extension distance of the latch portion 35f or 35fa from the molded body 35a is short, but long enough to penetrate the intermediate member 50 to some extent. Note that, when a semiconductor module that incorporates electronic components for two or three phases is used instead of the semiconductor module 35, in which electronic components for only one phase are installed, the outer shape thereof will be larger, hence a plurality of the latch portions 35f or 35fa may be disposed. Further, a protruding portion 35h is provided at a tip of the latch portion 35f or 35fa, and the protruding portion 35h and the inner wall of the hole 57 shown in FIG. 3 are locked into each other, whereby the semiconductor module 35 and the intermediate member 50 are fixed to each other.

When arranging the semiconductor module 35 on the intermediate member 50, the terminals 35b to 35e of the semiconductor module 35 are inserted into the holes 53 to 56 of the intermediate member 50, and the latch portion 35f or 35fa locks into the hole 57, that is, the engaged portion of the intermediate member 50. In this way, positioning of the semiconductor module 35 and the intermediate member 50 can be performed easily. Further, when the semiconductor module 35 is about to drop out from the intermediate member 50, the semiconductor module 35 moves so as to rotate about the latch portion 35f or 35fa. For this reason, the control terminals 35b and 35c on the opposite side to the latch portion 35f or 35fa catch in the holes 53 to 56 of the intermediate member 50. As a result, the semiconductor module 35 moves only slightly. In this way, it is possible to suppress positional deviation during assembly work, thereby improving assemblability. In addition, the latch portion 35f or 35fa is an extended portion of an existing lead frame and, due to the latch portion 35f or 35fa, it is also unnecessary to add a lead frame. Further, as shown in FIG. 5, the terminals 35b to 35f including the latch portion 35f or 35fa are all folded 90° so as to extend in an upward direction. By orienting the terminals 35b to 35f in the same direction in this way, connection operations are simplified and manufacturing is made easier. As the hole 57, that is, the engaged portion of the intermediate member 50, is formed by molding, machine processing is unnecessary. By respectively forming the latch portion 35f or 35fa and the hole 57 in this way, manufacturing costs can be suppressed while ensuring the accuracy required for positioning.

As described above, in the present embodiment, the lower frame 28, the yoke 27, the upper frame 40, the housing 19, and the cover 18 constitute the housing of the control device. The motor 2 and the control unit 1 are provided in the housing, and the motor 2 and the control unit 1 are integrated with each other. In addition, the upper frame 40 serves as a boundary plate which forms a boundary between the motor 2 and the control unit 1. Semiconductor modules 35, an intermediate member 50, and a control board 3 are stacked sequentially on the upper frame 40. In this embodiment, the latch portion 35f is provided on the semiconductor module 35 side and the hole 57, that is, the engaged portion, is provided on the intermediate member 50 side in order for the semiconductor module 35 and the intermediate member 50 to be engaged with each other. By fitting the latch portion 35f into the hole 57, the semiconductor module 35 and the intermediate member 50 are engaged with each other. In the present embodiment, a portion of a lead frame incorporated in the semiconductor module 35 is used as the latch portion 35f. For this reason, it is unnecessary to use a special component for the latch portion 35f, allowing manufacture to be performed at low cost and making the manufacturing process easier. Further, as positioning of the semiconductor module 35 is performed using the latch portion 35f and the hole 57, a positioning operation of the semiconductor module 35 is easy. Due to that which is described above, the control device according to the present embodiment can achieve the effect in which a semiconductor module can be appropriately and easily positioned while suppressing an escalation in cost.

Note that, in the present embodiment, it is indicated that the latch portion 35f is provided on the semiconductor module 35 side, and the hole 57 is provided on the intermediate member 50 side, however, the present invention is not limited to such a configuration, and this configuration may be reversed. However, at least one of the latch portion 35f and the hole 57 must be formed from an insulator.

Second Embodiment

Figure 7:
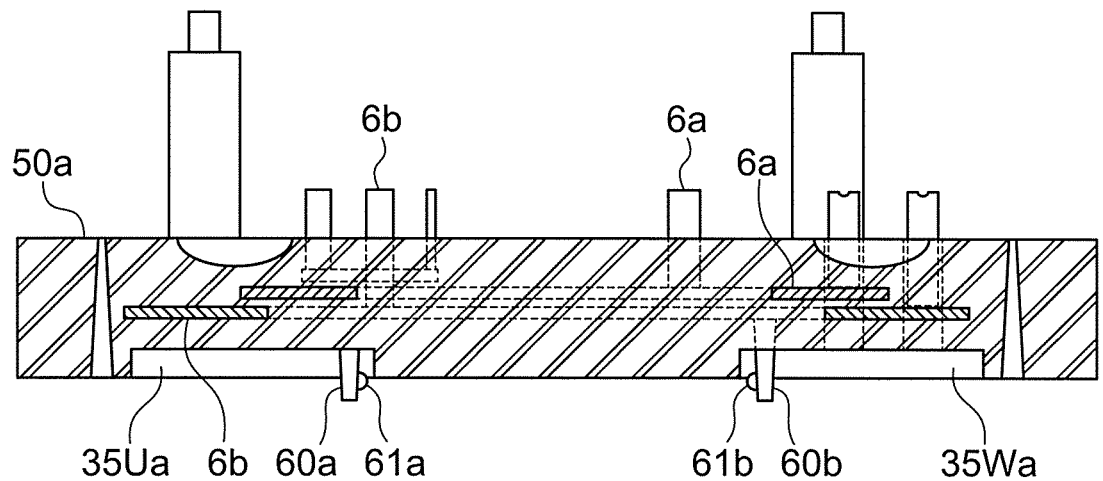
FIG. 7 is a cross-sectional view taken along the AA-AA line shown in FIG. 3 and showing a configuration of an intermediate member provided in a control device according to a second embodiment of the present invention.
Figure 8:
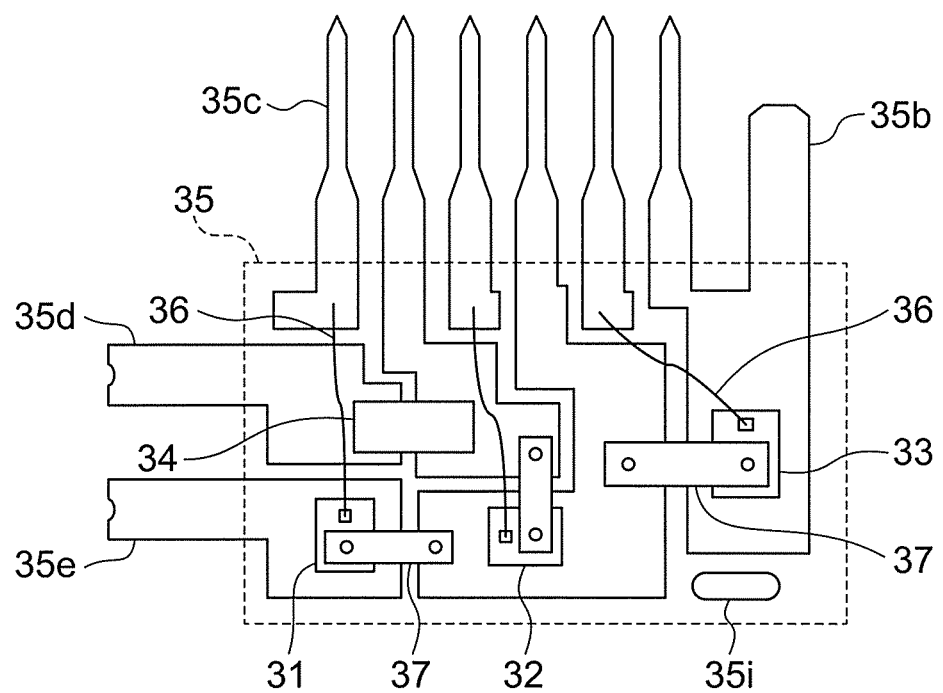
FIG. 8 is an internal perspective view showing a configuration of a semiconductor module provided in the control device according to the second embodiment of the present invention.

Next, a control device according to a second embodiment of the present invention will be described. FIG. 7 and FIG. 8 correspond to FIG. 4 and FIG. 6 of the first embodiment. In other words, FIG. 7 shows the configuration of an intermediate member, and FIG. 8 shows the configuration of a semiconductor module. In FIG. 7 and FIG. 8, the same reference numerals are given to structures that are the same as or correspond to those in FIG. 1 to FIG. 6, and description thereof here will be omitted. However, the intermediate member is distinguished from the intermediate member 50 of the first embodiment and is thus referred to as the intermediate member 50a. Note that the configuration of the entire control device is fundamentally the same as that shown in FIG. 1 and FIG. 2 and described in the first embodiment. Accordingly, description of this configuration here will be omitted, and only aspects which differ from the first embodiment will mainly be described below.

FIG. 7 is a cross-sectional view of the intermediate member 50a. The difference between FIG. 4 and FIG. 7 is that in FIG. 7, a latch portion 60a is provided on the intermediate member 50a in place of the hole 57 provided in the intermediate member 50 shown in FIG. 4. The latch portion 60a protrudes in a downward direction from a lower surface of the intermediate member 50a. The latch portion 60a is made from the same material as the intermediate member 50a and is formed by the same process as the intermediate member 50a. As the intermediate member 50a is formed from an insulating resin, it is possible to mold the latch portion 60a and the intermediate member 50a at the same time and integrally using a single mold, such that manufacturing can be performed easily and at low cost. When attaching the semiconductor module 35, the latch portion 60a is inserted into a hole 35i, described hereinafter, in the semiconductor module 35. Accordingly, the hole 35i constitutes an engaged portion to be engaged by the latch portion 60a. Further, a protrusion 61a is provided on a tip portion of the latch portion 60a. The protrusion 61a and the inner wall of the hole 35i of the semiconductor module 35 lock into each other, whereby the semiconductor module 35 and the intermediate member 50 are fixed to each other.

However, as a separate embodiment, a portion of the bus bar of the power line 6a or the ground line 6b incorporated in the intermediate member 50 may be used as a latch portion 60b. As shown in FIG. 7, the latch portion 60b extends in a downward direction from the lower surface of the intermediate member 50. A protrusion 61b is provided at a tip of the latch portion 60b. The protrusion 61b and the inner wall of the hole 35i, that is, the engaged portion of the semiconductor module 35, lock into each other. The latch portion 60b is an elongated portion of one of the bus bars, the ground line 6b, for example, and has the same configuration as the terminals 35b, 35d, and 35e of the semiconductor module 35.

The latch portion 60a or 60b shown in FIG. 7 is inserted into the hole 35i of the semiconductor module 35. FIG. 8 shows an internal perspective view of the semiconductor module 35. The difference between FIG. 8 and FIG. 6 of the first embodiment is that, in FIG. 8, the hole 35i is provided in place of the latch portion 35f in FIG. 6. The hole 35i constitutes an engaged portion into which the latch portion 60a or 60b provided in the intermediate member 50a is inserted. The hole 35i is constituted by a component incorporated into the semiconductor module 35, a lead frame for example. Further, the hole 35i is provided in a location where the switching elements 31 to 33 are not disposed. Moreover, the hole 35i is provided on the side of a side at which the terminals of the semiconductor module 35 are not provided. In other words, the hole 35i is arranged on the side of the opposite side to the motor control terminal 35b and the control terminals 35c. Alternatively, the hole 35i may be arranged on the side of the opposite side to the power supply system terminals 35d and 35e.

As described above, in this embodiment, the arrangement of the latch portion and the hole, that is, the engaged portion, is reversed from that of the first embodiment. In other words, in the present embodiment, the latch portion 60a or 60b is provided on the intermediate member 50a side rather than on the semiconductor module 35 side, and the hole 35i, that is, the engaged portion, is provided on the semiconductor module 35 side rather than on the intermediate member 50 side. In the present embodiment, the intermediate member 50a and the latch portion 60a are integrally molded from an insulating resin, or, a part of one of the bus bars of the power supply system lines 6a and 6b incorporated in the intermediate member 50 is used as the latch portion 60b, whereby manufacture can be performed easily and at low cost. Hence, similarly to the first embodiment, the effect can be achieved in which a semiconductor module can be appropriately and easily positioned while suppressing an escalation in cost.

Note that, in the first and second embodiments described above, a motor for assisting the steering force of a steering wheel (not shown) to be provided in a vehicle is given as an example of the motor 2, however, the present invention is not limited thereto and, needless to say, may be applied to motors in general as long as the motor to which the present invention is applied is a motor that is integrated with a control unit equipped with a semiconductor module.

The invention claimed is:
1. A control device comprising:
a housing;
a motor provided in the housing;
a control unit provided in the housing and used for controlling the motor; and
a frame arranged in the housing and constituting a boundary plate between the motor and the control unit, wherein
a semiconductor module, an intermediate member, and a control board are stacked sequentially in the control unit,
the semiconductor module is disposed between the frame and the intermediate member so as to be in contact with the frame and the intermediate member,
the semiconductor module is provided with connection terminals and a latch portion,
an engagement portion is provided on the intermediate member,
at least one of the latch portion and the engagement portion is formed from an insulator,
the semiconductor module and the intermediate member are engaged with each other by engaging the latch portion with the engagement portion,
recessed portions for positioning a plurality of semiconductor modules are provided in a lower surface of the intermediate member,
the recessed portions are arranged sequentially counter clockwise around the shaft, and
terminal holes are formed adjacent to the recessed portions.
2. The control device according to claim 1, wherein
the latch portion is formed by elongating a portion of a lead frame provided in the semiconductor module.
3. The control device according to claim 1, wherein at least one other recessed portion is provided in an upper surface of the intermediate member so as to hug an outer shape of at least one capacitor.
4. The control device according to claim 1, wherein the intermediate member comprises at least two different types of holes including a first type of hole corresponding to a hole that allows a terminal to pass through, and a second type of hole having a conical shape in which a terminal is not allowed to pass through.
5. The control device according to claim 1, wherein the intermediate member is formed from an insulating resin.
6. The control device according to claim 1, wherein
a plurality of terminals, which include a motor control terminal connected to a coil winding terminal of the motor, a control terminal to which a control command signal is input from the control board, and a power supply system terminal, are disposed on at least one side of the semiconductor module, and
the latch portion is disposed on another side of the semiconductor module at which the plurality of terminals are not disposed.
7. The control device according to claim 6, wherein
the latch portion provided on the semiconductor module, the motor control terminal, the control terminal, and the power supply system terminal are all folded so as to extend in the same direction.
8. A control device comprising:
a housing;
a motor provided in the housing;
a control unit provided in the housing and used for controlling the motor; and
a frame arranged in the housing and constituting a boundary plate between the motor and the control unit, wherein
a semiconductor module, an intermediate member, and a control board are stacked sequentially in the control unit,
the semiconductor module is disposed between the frame and the intermediate member so as to be in contact with the frame and the intermediate member,
the semiconductor module is provided with connection terminals and a latch portion,
an engagement portion is provided on the intermediate member,
at least one of the latch portion and the engagement portion is formed from an insulator,
the semiconductor module and the intermediate member are engaged with each other by engaging the latch portion with the engagement portion, and
the intermediate member comprises at least two different types of holes including a first type of hole corresponding to a hole that allows a terminal to pass through, and a second type of hole having a conical shape in which a terminal is not allowed to pass through.

9. The control device according to claim 8, wherein the latch portion is formed by elongating a portion of a lead frame provided in the semiconductor module.

10. The control device according to claim 8, wherein recessed portions for positioning a plurality of semiconductor modules are provided in a lower surface of the intermediate member, the recessed portions are arranged sequentially counter clockwise around a shaft, and terminal holes are formed around the recessed portions.

11. The control device according to claim 8, wherein recessed portions are provided in an upper surface of the intermediate member so as to hug an outer shape of capacitors.

12. The control device according to claim 8, wherein the intermediate member is formed from an insulating resin.

13. The control device according to claim 8, wherein a plurality of terminals, which include a motor control terminal connected to a coil winding terminal of the motor, a control terminal to which a control command signal is input from the control board, and a power supply system terminal, are disposed on at least one side of the semiconductor module, and the latch portion is disposed on another side of the semiconductor module at which the plurality of terminals are not disposed.

14. The control device according to claim 13, wherein the latch portion provided on the semiconductor module, the motor control terminal, the control terminal, and the power supply system terminal are all folded so as to extend in the same direction.

* * * * *